(12) United States Patent
Spear et al.

(10) Patent No.: US 11,973,630 B1
(45) Date of Patent: Apr. 30, 2024

(54) CALIBRATING A QUADRATURE RECEIVE SERIAL INTERFACE

(71) Applicant: International Business Machines Corporation, Armonk, NY (US)

(72) Inventors: Michael B. Spear, Round Rock, TX (US); Daniel Mark Dreps, Georgetown, TX (US); Erik English, Salt Point, NY (US); Jieming Qi, Austin, TX (US); Michael Sperling, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 18/059,264

(22) Filed: Nov. 28, 2022

(51) Int. Cl.
*H04L 27/00* (2006.01)
*H04L 27/36* (2006.01)

(52) U.S. Cl.
CPC ........ *H04L 27/364* (2013.01); *H04L 27/0014* (2013.01); *H04L 2027/0018* (2013.01)

(58) Field of Classification Search
CPC .............. H04L 27/0014; H04L 27/364; H04L 2027/0018
See application file for complete search history.

(56) References Cited

U.S. PATENT DOCUMENTS

| | | | |
|---|---|---|---|
| 7,403,584 B2 | 7/2008 | Koenenkamp | |
| 8,139,700 B2 | 3/2012 | Beukema et al. | |
| 8,552,781 B2 | 10/2013 | Mosalikanti et al. | |
| 8,654,885 B2 | 2/2014 | Lee et al. | |
| 8,681,839 B2 | 3/2014 | Bulzacchelli et al. | |
| 9,473,172 B2 | 10/2016 | Chieco et al. | |
| 9,477,259 B2 | 10/2016 | Jeter et al. | |
| 9,698,968 B2 | 7/2017 | Bonaccio et al. | |
| 10,171,281 B2 | 1/2019 | Dickson et al. | |
| 10,320,332 B2 | 6/2019 | Francese | |
| 10,419,059 B2 | 9/2019 | Tzannes et al. | |
| 11,184,203 B2 | 11/2021 | Razzell | |

(Continued)

OTHER PUBLICATIONS

X. Li et al., "Compensation for In-Phase/Quadrature Phase Mismatch in Coherent Free-Space Optical QPSK Communication Systems," Applied Sciences 2021, 11, 2543, pp. 1-11.

(Continued)

*Primary Examiner* — Rahel Guarino
(74) *Attorney, Agent, or Firm* — Patterson + Sheridan, LLP

(57) ABSTRACT

An enhanced quadrature receive serial interface circuit and methods are provided for calibrating the quadrature receive serial interface circuit. A quadrature receive serial interface circuit comprises a first phase rotator and a second phase rotator generating quadrature clocks of identical frequency. Calibration of the quadrature receive serial interface circuit uses a pseudo random bit sequence (PRBS) received by the quadrature receive serial interface circuit. For calibration, one-half of the received PRBS bits are sampled and the phase rotator generating in-phase 0° and 180° clock signals is adjusted to center the data eye for the sampled half of the PRBS bits. Then all data bits (even and odd data bits) of the received PRBS bits are sampled and the phase rotator generating quadrature phase 90° and 270° clock signals is adjusted to center the data eye of all data bits of the PRBS bits to complete calibration.

20 Claims, 5 Drawing Sheets

(56) References Cited

U.S. PATENT DOCUMENTS

| | | |
|---|---|---|
| 11,201,723 B1 | 12/2021 | Lam et al. |
| 11,245,407 B2 | 2/2022 | Petrov et al. |
| 2006/0274874 A1 | 12/2006 | Kumar et al. |
| 2009/0154626 A1 | 6/2009 | Anderson et al. |
| 2012/0039375 A1 | 2/2012 | Eitel |
| 2015/0222377 A1* | 8/2015 | Chieco .................. H04J 3/0685 370/503 |
| 2021/0111859 A1 | 4/2021 | Gaade |
| 2021/0367603 A1 | 11/2021 | Zhang et al. |
| 2022/0021378 A1 | 1/2022 | Delbecq et al. |

OTHER PUBLICATIONS

P. A. Francese et al., "A 16 GB/s 3.7 mW/GB/s 8-Tap DFE Receiver and Baud-Rate CDR With 31 kppm Tracking Bandwidth," IEEE Journal of Solid-State Circuits, vol. 49, No. 11, Dated: Nov. 2014, pp. 1-14.

S. Ma et al., "A Quadrature PLL with Phase Mismatch Calibration for 32GS/s Time-Interleaved Adc," IEEE Access, Dated: Dec. 17, 2020, pp. 219695-219708.

Frank O'Mahony et al., "A Programmable Phase Rotator based on Time-Modulated Injection-Locking," Symposium on VLSI Circuits/ Technical Digest of Technical Papers, Year: 2010, pp. 45-46.

A. Abbas et al., "Fast-Locking Burst-Mode Clock and Data Recovery for Parallel VCSEL-BAsed Optical Link Receivers," IEEE Access, Digital Object Idenifier vol. 10, Year: 2022, pp. 34306-34320.

A. Zargaran-Yazd et al., "12.5-GB/s Full-Rate CDR with Wideband Quadrature Phase Shifting in Data Path," IEEE Transactions on Circuits and Systems-II: Express Briefs, vol. 60, No. 6, Dated: Jun. 2013, Year: 297-301.

Immanuel Raja et al., "A 0.1-2-GHz Quadrature Correction Loop for Digital Multiphase Clock Generation Circuits in 130-nm CMOS," IEEE Transactions on Very Large Scale Integration (VLSI) Systems. vol. 25, No. 3, Dated Mar. 2017, pp. 1044-1053.

H. Lee et al., "A 16 GB/s/Link, 64 GB/s Bidirectional Asymmetric Memory Interface," IEEE Journal of Solid-State Circuits, vol. 44, No. 4, Dated: Apr. 2009, pp. 1235-1247.

A. Joshi et al., "An Odd Phase CDR With Phase Interpolator Trimming," IEEE Transactions on Circuits and Systems-II: Express Briefs, vol. 66, No. 1, Dated: Jan. 2019, pp. 31-35.

International Search Report and Written Opinion for International Application No. PCT/ EP2023/082776 mailed Mar. 1, 2024.

* cited by examiner

CALIBRATING A QUADRATURE RECEIVE SERIAL INTERFACE

BACKGROUND

The present invention relates to digital data processing, and more specifically, to a quadrature receive serial interface circuit and methods for calibrating the quadrature receive serial interface circuit for high-speed chip-to-chip serial communication system.

In high-speed chip-to-chip communication, quadrature sampling reduces the speed requirements of data samplers in a receive interface, allowing the receive interface to run faster. One problem with using quadrature data sampling is the difficulty to align to quadrature clocks. Another problem is that current quadrature receive serial interface circuits use an IQ generator typically requiring significant power to provide quadrature clocks. Also, received data may have different delay for the even and odd bits resulting from the duty cycle of the transmitter or other transmitter architecture drawbacks. New techniques are needed to calibrate a quadrature receive serial interface circuit that can compensate for variations in received data, for example resulting from static and dynamic factors such as supply voltages, operating temperature, and the like.

SUMMARY

Embodiments of the present disclosure are directed to an enhanced quadrature receive serial interface circuit and methods for calibrating a quadrature receive serial interface circuit. A quadrature receive serial interface circuit comprises a first phase rotator and a second phase rotator generating four quadrature clocks of identical frequency, the first phase rotator generating in-phase 0° and 180° clock signals and the second phase rotator generating quadrature phase 90° and 270° clock signals. The in-phase 0° and 180° clock signals are applied to a first pair of first sampling latches and the quadrature phase 90° and 270° clock signals are applied to a second pair of the first sampling latches. The quadrature receive serial interface circuit includes a pseudo random bit sequence (PRBS) checker.

A non-limiting method of one disclosed embodiment implements calibration of the quadrature receive serial interface circuit. A pseudo random bit sequence (PRBS) is sent to the quadrature receive serial interface circuit for calibrating the quadrature receive serial interface circuit. The PRBS checker of the quadrature receive serial interface is set to sample each other bit or one-half of the received PRBS data bits, such as even data bits of the PRBS. The first phase rotator generating in-phase 0° and 180° clock signals is adjusted to center a data eye for the even data bits of the PRBS using the PRBS checker. Then the PRBS checker is set to sample all (even and odd) data bits of the PRBS. The second phase rotator generating quadrature phase 90° and 270° clock signals is adjusted to center the data eye for all data bits of the PRBS. After calibration, a functional data stream is sent to the quadrature receive serial interface circuit for normal data communication.

DETAILED DESCRIPTION

Figure 1:
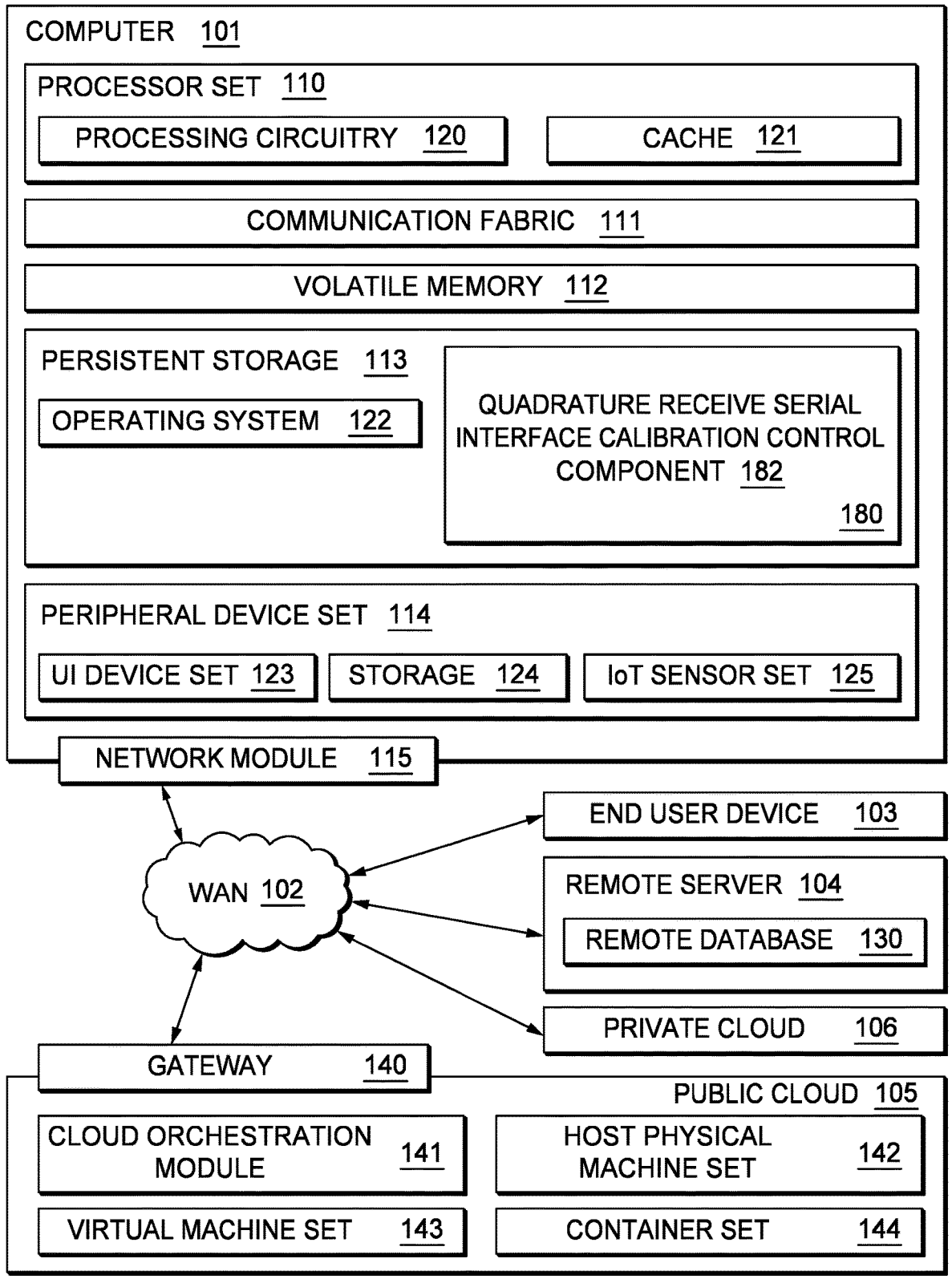
FIG. 1 is a block diagram of an example computer environment for use in conjunction with one or more embodiments for calibration of a quadrature receive serial interface circuit.

Embodiments of the present disclosure provide an enhanced quadrature receive serial interface circuit and methods for calibrating the quadrature receive serial interface circuit. In one embodiment, a quadrature receive serial interface circuit comprises a first phase rotator and a second phase rotator generating four quadrature clocks of identical frequency, the first phase rotator generating in-phase 0° and 180° clock signals and the second phase rotator generating quadrature phase 90° and 270° clock signals. The in-phase 0° and 180° clock signals are applied to a first pair of first sampling latches and the quadrature phase 90° and 270° clock signals are applied to a second pair of the first sampling latches. Sampled data bits of the first sampling latches are applied to a deserializer and synchronized to 0° phase. The quadrature receive serial interface circuit includes a pseudo random bit sequence (PRBS) checker coupled to the deserializer. The PRBS checker enables calibration of the quadrature receive serial interface circuit without requiring complex calibration pattern generation, extra circuitry or any modification of the PRBS or the PRBS checker.

An enhanced method is provided for calibrating a quadrature receive serial interface circuit that comprises sending a PRBS to the quadrature receive serial interface circuit for calibrating the quadrature receive serial interface circuit. The PRBS checker is set to sample even data bits of the received PRBS. The first phase rotator generating in-phase 0° and 180° clock signals is adjusted to center a data eye of the even data bits of the PRBS using the PRBS checker. In one embodiment, the PRBS checker is set to sample all (even and odd) data bits of the PRBS. In one embodiment, the second phase rotator generating quadrature phase 90° and 270° clock signals is adjusted to center the data eye of all the data bits of the PRBS using the PRBS checker to complete calibration. After calibration, a functional data stream is sent to the quadrature receive serial interface circuit for normal data communication.

Some non-limiting advantages of the present disclosure are that the enhanced quadrature receive serial interface circuit includes a pair of phase rotators generating four quadrature clocks of identical frequency, one phase rotator generating in-phase 0° and 180° clock signals and the other phase rotator generating quadrature phase 90° and 270° clock signals. The enhanced quadrature receive serial interface circuit eliminates the need for an IQ generator within the receiver to generate the four quadrature clocks, reducing power requirements. The enhanced quadrature receive serial interface circuit effectively and efficiently generates four quadrature clocks with the pair of phase rotators. Calibration of the quadrature receive serial interface circuit is based on sampled data bits of the received PRBS, compensating for variations in the received data. In one embodiment, calibration of the quadrature receive serial interface circuit includes first adjusting the phase rotator generating in-phase 0° and 180° clock signals to center the data eye based on half of the received PRBS bits, such as even data bits of the received PRBS bits. Then the phase rotator generating the quadrature phase 90° and 270° clock signals is adjusted to center the data eye of all data bits (even and odd data bits) of the PRBS bits. Calibration of the quadrature receive serial interface circuit uses the PRBS and PRBS checker, without requiring complex pattern generation. Calibration of the quadrature receive serial interface circuit can be provided at power-on and dynamically, enabling effective and reliable operation of the quadrature receive serial interface circuit. The quadrature receive serial interface circuit eliminates the need for a conventional IQ generator within the receiver to provide quadrature clocks, and significantly reduces required power.

The descriptions of the various embodiments of the present invention are presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Referring to FIG. 1, a computing environment 100 contains an example of an environment for the execution of at least some of the computer code involved in performing the inventive methods, such as Quadrature Receive Serial Interface Calibration Control Component 182 at block 180. In addition to block 180, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 180, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 180 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 180 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Embodiments of the disclosure provide an enhanced quadrature receive serial interface circuit of a communications interconnect system and methods for calibrating the quadrature receive serial interface circuit. The enhanced quadrature receive serial interface circuit comprises a first phase rotator and a second phase rotator generating four quadrature clocks of identical frequency. For example, the first phase rotator generates in-phase 0° and 180° clock signals and the second phase rotator generates quadrature phase 90° and 270° clock signals. The quadrature receive serial interface circuit comprises a data sampler including multiple first sampling latches. The quadrature receive serial interface circuit includes a pseudo random bit sequence (PRBS) checker used for calibration of the quadrature receive serial interface circuit receiving a PRBS. The in-phase 0° and 180° clock signals are applied to a first pair of the first sampling latches and the quadrature phase 90° and 270° clock signals are applied to a second pair of first sampling latches. A pseudo random bit sequence (PRBS) is sent to the quadrature receive serial interface circuit for calibrating the quadrature receive serial interface circuit. Calibration of the quadrature receive serial interface circuit is based on sampled data bits of the received PRBS, which can compensate for variations in the received data.

An enhanced method for calibrating the quadrature receive serial interface circuit comprises sending a pseudo random bit sequence (PRBS) received by the quadrature receive serial interface circuit. The phase rotator generating in-phase 0° and 180° clock signals is adjusted to center the data eye based on the sampled one-half or every other bit of the received PRBS bits, such as even data bits of the received PRBS bits. Then the phase rotator generating quadrature phase 90° and 270° clock signals is adjusted to center the data eye of all data bits (even and odd data bits) of the PRBS bits. Calibration of the quadrature receive serial interface circuit uses the PRBS and PRBS checker, without requiring complex pattern generation. Calibration of the quadrature receive serial interface circuit can be provided at power-on and dynamically, enabling effective, reliable functional operation of the quadrature receive serial interface circuit. After calibration is completed, a functional data stream is sent to the quadrature receive serial interface circuit for normal data communication.

Figure 2A:
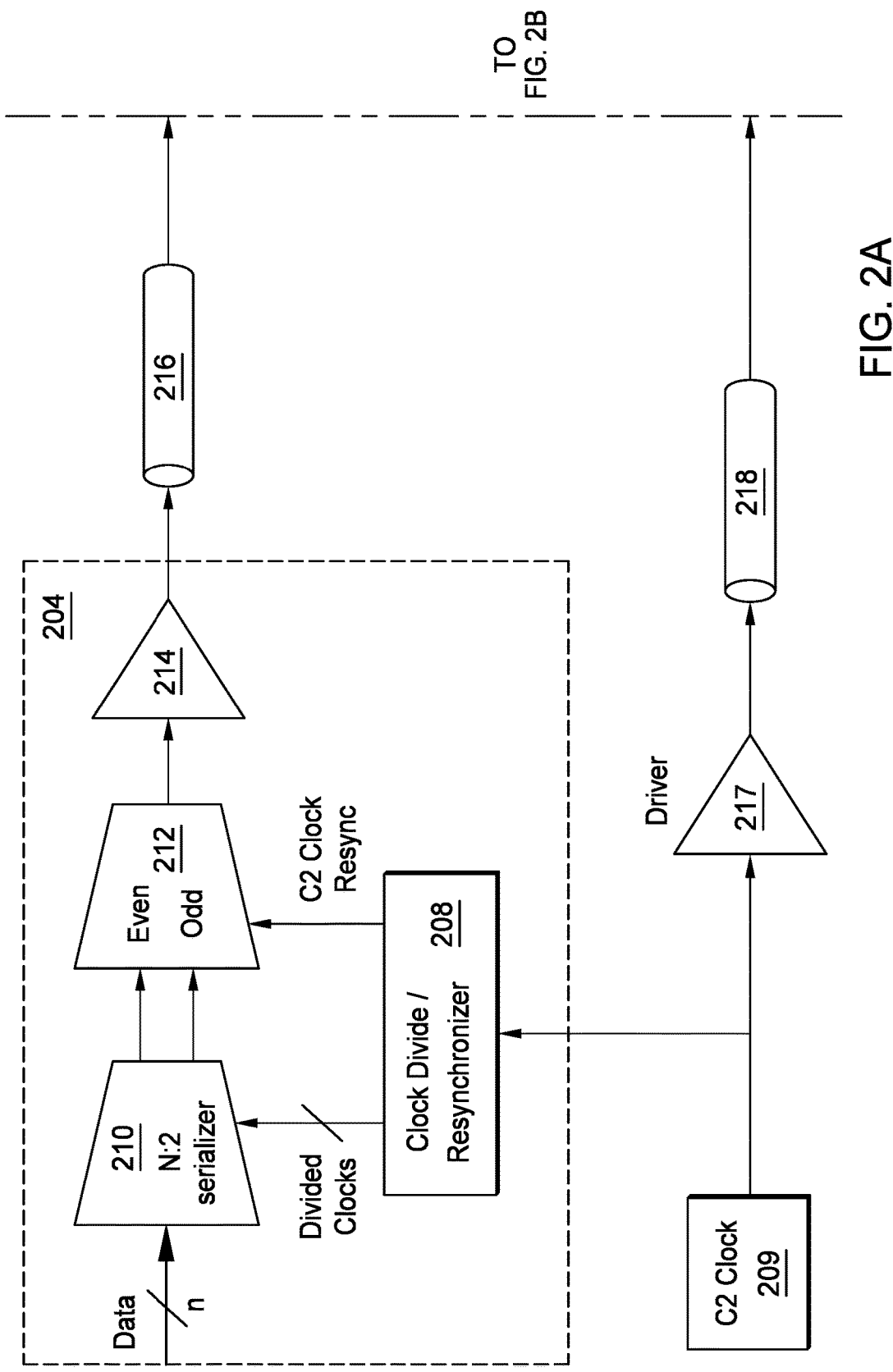
FIGS. 2A and 2B together provide a schematic and block diagram illustrating a communications circuit of one or more embodiments for calibration of a quadrature receive serial interface circuit.
Figure 2B:
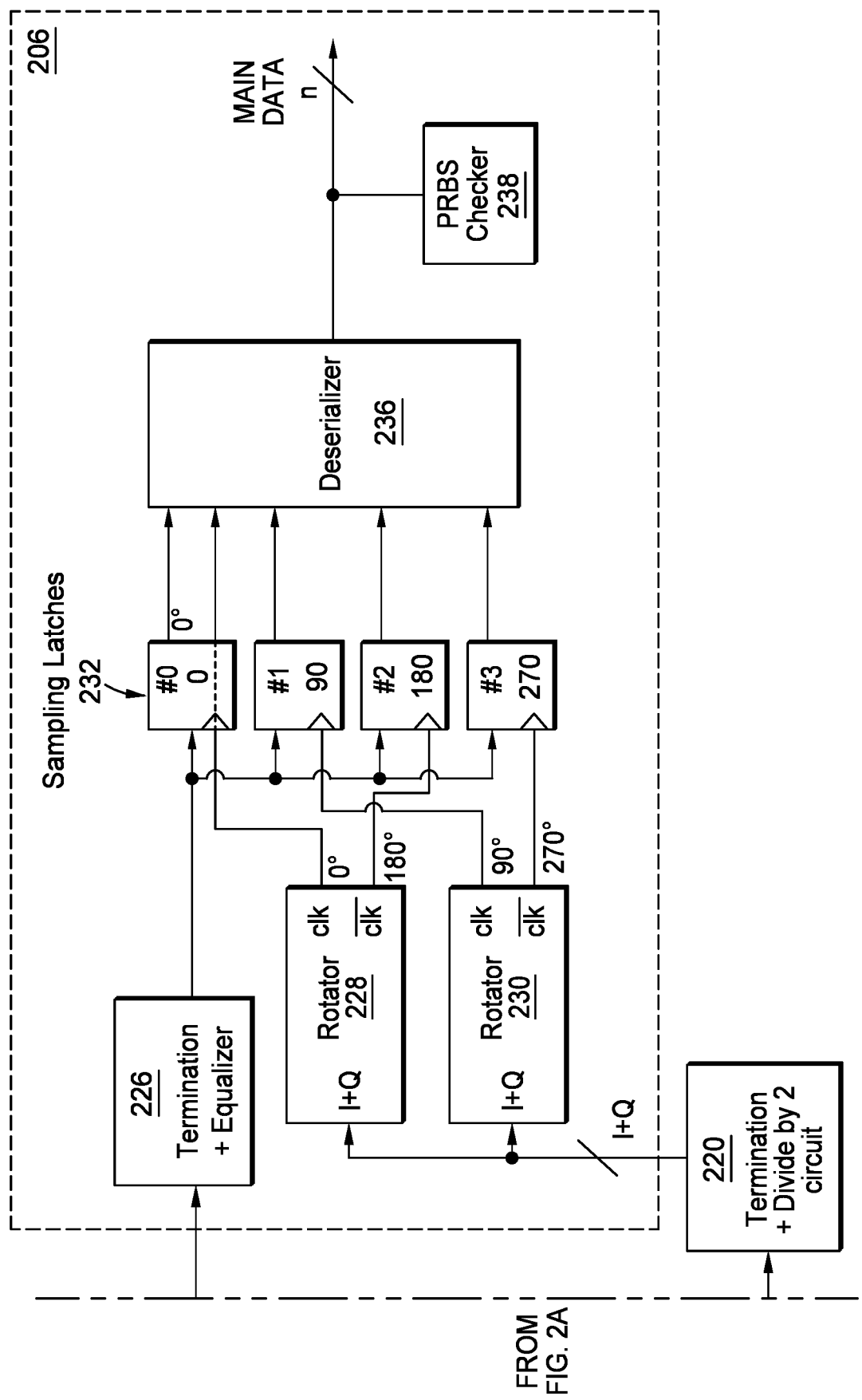

FIGS. 2A and 2B together illustrate an example communications interconnect system 200 configured for implementing calibration of a quadrature receive serial interface circuit 206 of a disclosed embodiment. Communications interconnect system 200 enables high speed chip to chip communication using quadrature sampling, reducing speed requirements of data samplers of the quadrature receive serial interface circuit 206. Communications system 200 can be used for example with the computer 101 together with the Quadrature Receive Serial Interface Calibration Control Component 182 of FIG. 1 for implementing calibration control operations of disclosed methods.

Communications interconnect system 200 includes a transmit serial interface circuit 204 and the quadrature receive serial interface circuit 206 connected by a bus 216 (e.g., a double data rate (DDR) bus). The transmit serial interface circuit 204 includes a Clock Divide and Resynchronizer (Resync) 208 receiving an interface input C2 clock 209. The transmit serial interface circuit 204 includes an N:2 serializer 210 that receives and serializes parallel inputs providing respective Even and Odd serial data inputs to a multiplexer 212. The Clock Divide and Resynchronizer 208 provides a divided clock to the serializer 210 and a C2 clock Resync to the multiplexer 212. In one embodiment, a data driver 214 operating with double data rate (DDR) transfers data on both the rising and falling edges of the C2 clock Resync signal to the bus 216. The DDR serial data transfers of data driver 214 to the DDR bus 216 are received by the quadrature receive serial interface circuit 206. The interface input C2 clock 209 transmits the C2 clock signal via a clock driver 217 and a clock interface link or clock bus 218 to a Termination and Divide by 2 circuit 220. The clock Termination and Divide by 2 circuit 220 provides a divided clocks input to the quadrature receive serial interface circuit 206.

For example, the interface input C2 clock 209 provides a 20 GHz clock signal to the Clock Divide and Resynchronize 208 of the transmit serial interface circuit 204, which provides a divided clock input of 10 GHz clock signal to the serializer 210 and a C2 clock Resync signal of 20 GHz to the multiplexer 212. The interface input C2 clock 209 also provides the 20 GHz clock signal to the Termination and Divide by 2 circuit 220 which provides a divided clock signal input of in-phase and quadrature inputs (I+Q) clocks of 10 GHz clock signal to the quadrature receive serial interface circuit 206.

Referring to FIG. 2B, the quadrature receive serial interface circuit 206 includes a Termination and Equalizer 226 connected to the bus 216. The Termination and Equalizer 226 receives and equalizes serial data transfers from the driver 214 via bus 216 The quadrature receive serial interface circuit 206 includes a first phase rotator 228 and a second phase rotator 230 that receive the in-phase and quadrature inputs I+Q clocks input from the external Termination and Divide by 2 circuit 220.

The first phase rotator 228 and a second phase rotator 230 generate four quadrature clock signals of identical frequency, the first phase rotator 228 generating in-phase 0° and 180° clock signals and the second phase rotator 230 generating quadrature phase 90° and 270° clock signals used for data sampling. A quadrature receive serial interface data sampler comprises first sampling latches 232, #0-3 receiving respective quadrature 0°, 90°, 180°, and 270° clock signals (one latch for each bit) with sampled data bits of the first sampling latches coupled to a deserializer 236 where, in one embodiment, all data bits are synchronized back to the 0° phase. The DDR serial data transfers from data driver 214 received by the Termination and Equalizer 226 are provided to the respective first sampling latches 232, #0-3 receiving respective quadrature 0°, 90°, 180°, and 270° clock signals.

As shown, the in-phase 0° and 180° clock signals of the first phase rotator 228 are applied to a first pair of even sampling latches 232, #0 and #2. The quadrature phase 90° and 270° clock signals of the second phase rotator 230 are applied to a second pair of odd sampling latches 232, #1 and #3. The deserializer 236 receives the respective sampled data bits of the first sampling latches at a respective data input and are synchronized back to the 0° phase, which provides parallel output data. The quadrature receive serial interface circuit comprises a PRBS checker 238 coupled to the deserializer 236, receiving PRBS output data during calibration. During calibration, the PRBS checker 238 checks for valid parallel PRBS output data received from the deserializer 236. The PRBS checker 238 is used during calibration to center a valid data eye of sampled PRBS data bits.

During calibration, a PRBS is input to the serializer 210 and received by the quadrature receive serial interface circuit 206. The first phase rotator 228 generating the in-phase 0° and 180° clock signals is adjusted to center a data eye of initial sampled one-half data bits of the PRBS, such as even data bits of the PRBS, using the PRBS checker 238. In one embodiment, after adjusting the first phase rotator 228, the PRBS checker 238 is set by the Calibration Control Component 182 to sample all (both even and odd) data bits of the PRBS. The second phase rotator 230 generating the quadrature phase 90° and 270° clock signals is adjusted to center the data eye of all data bits of the PRBS, using the PRBS checker 238. Next when calibration is completed, a data stream is transmitted to the quadrature receive serial interface circuit 206 for normal data communication.

Figure 3:
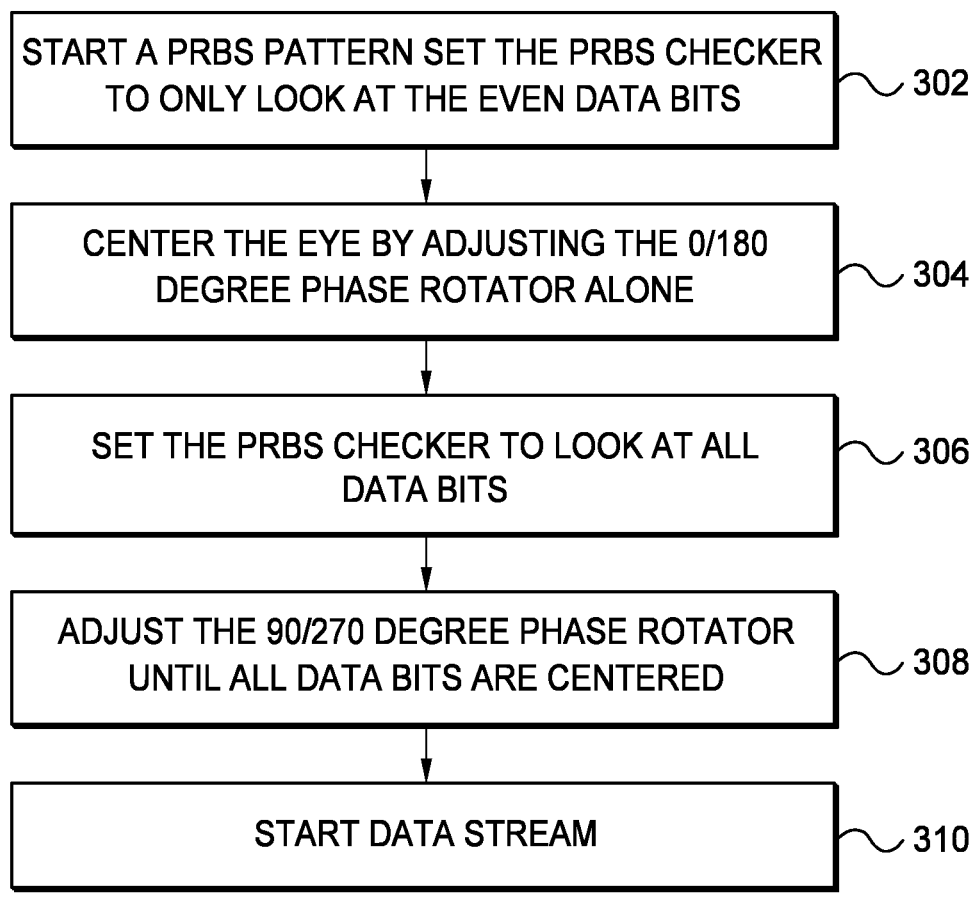
FIG. 3 is a flow chart illustrating example operations of one or more embodiments for calibration of a quadrature receive serial interface circuit.

Referring also to FIG. 3, there are shown example operational functions of a method 300 of one or more embodiments for calibrating the quadrature receive serial interface circuit 206. At block 302, a PRBS pattern is provided for calibrating the quadrature receive serial interface circuit and the Calibration Control Component 182 sets the quadrature receive serial interface circuit 206 to sample one half data bits of PRBS, such as only the even data bits of the PRBS. For example, the PRBS checker 238 is set by the Calibration Control Component 182 to sample one-half of the PRBS, such as even data bits of the PRBS. The sampled half data bits of the PRBS provides a valid PRBS pattern and can save time required to adjust the first phase rotator 228. At block 304 the Calibration Control Component 182 uses input from the PRBS checker 238 to adjust the first phase rotator 228 generating in-phase 0° and 180° clock signals to center a data eye of the sampled in-phase half data bits of the PRBS.

For example, the PRBS checker identifies good data at a first edge of the data eye and the Calibration Control Component 182 adjusts the first phase rotator 228 through the data eye to the other edge of the data eye. The Calibration Control Component 182 sets the first phase rotator 228 aligned with the data eye center of good data, using input from the PRBS checker 238 at block 304. In one embodiment, at block 304 the second phase rotator 230 generating quadrature phase 90° and 270° clock signals is not adjusted.

At block 306, the Calibration Control Component 182 sets the PRBS checker 238 of quadrature receive serial interface circuit 206 to sample all data bits of the PRBS. For example, the PRBS checker 238 is set by Calibration Control Component 182 to sample all (both even and odd) data bits of the PRBS at block 306. At block 308, the PRBS checker 238 adjusts the second phase rotator 230 generating quadrature phase 90° and 270° clock signals to center the data eye of all data bits of the PRBS, using input from the PRBS checker 238. At block 310 with calibration completed the PRBS stops being input into the quadrature receive serial interface circuit 206 and a functional data stream is transmitted to the quadrature receive serial interface circuit 206 for normal data communication.

Figure 4:
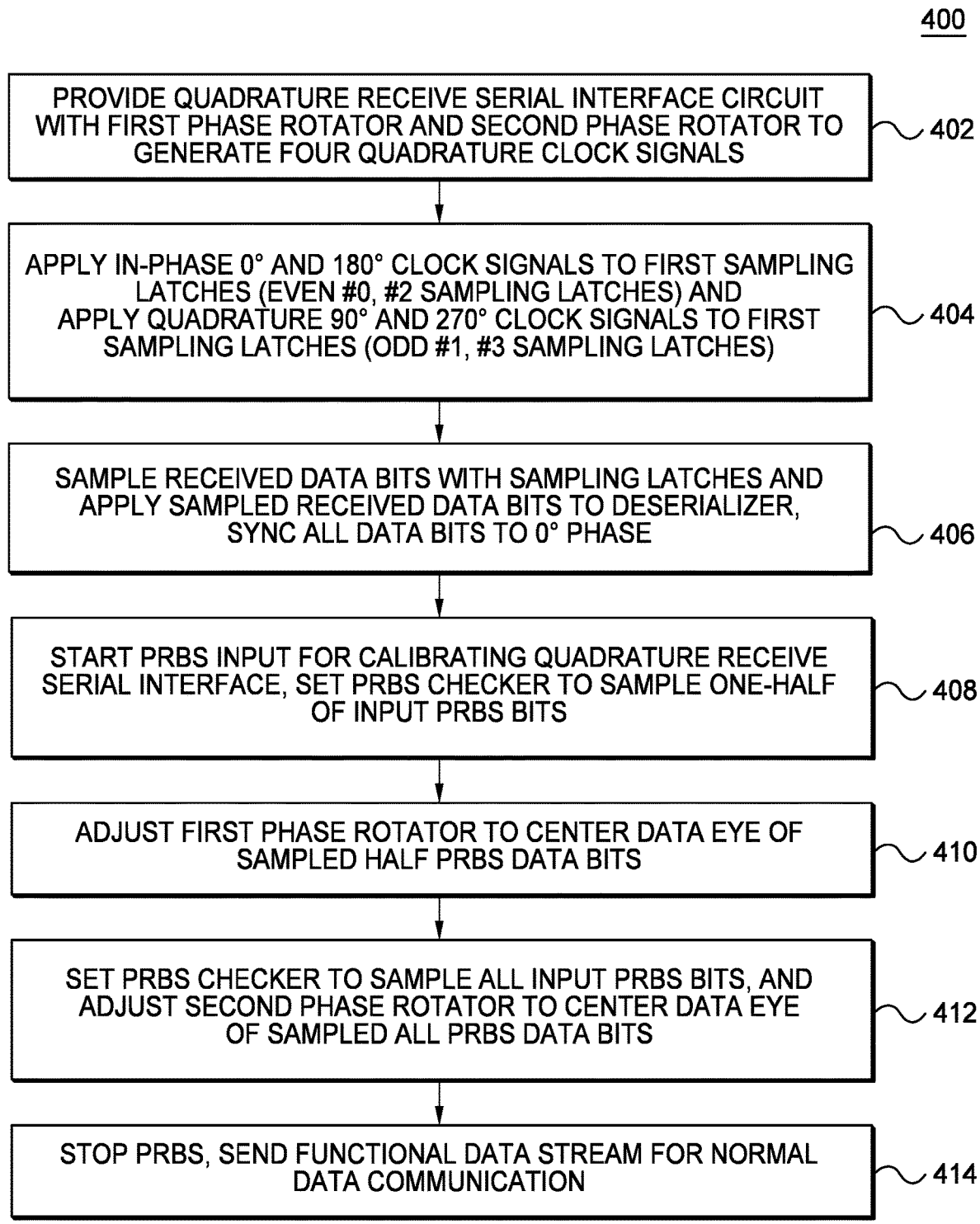
FIG. 4 is a flow chart illustrating example operational functions of one or more embodiments for calibration of a quadrature receive serial interface circuit.

Referring also to FIG. 4, there is shown a flow chart illustrating a method 400 of one or more embodiments for calibration of a quadrature receive serial interface circuit.

As indicated at block 402, the quadrature receive serial interface circuit 206 is provided with a first phase rotator and a second phase rotator for generating four quadrature clocks of identical frequency. At block 404, the first phase rotator generates in-phase 0° and 180° clock signals that are applied to a first pair of first sampling latches 232 and the second phase rotator generates quadrature phase 90° and 270° clock signals that are applied to a second pair of the first sampling latches 232. At block 406, the first sampling latches 232 sample the received data bits to the quadrature receive serial interface circuit 206 that are applied to the deserializer 236 and synchronized to 0° phase. The deserializer 236 of the quadrature receive serial interface circuit 206 is coupled to the pseudo random bit sequence (PRBS) checker 238.

At block 408 calibration of the quadrature receive serial interface circuit begins with the Calibration Control Component 182 starting a pseudo random bit sequence (PRBS) and the PRBS checker 238 samples every other bit or one-half of the received PRBS. At block 410 the Calibration Control Component 182 with the PRBS checker 238 adjusts the first phase rotator 228 generating in-phase 0° and 180° clock signals to center a data eye of the sampled one-half PRBS data bits, using the PRBS checker 238. For example, the PRBS checker 238 identifies good data at a first edge of the data eye and the Calibration Control Component 182 adjusts the first phase rotator 228 through the data eye to the other edge of the data eye, and sets the first phase rotator 228 to the data eye center at block 410. At block 412, the Calibration Control Component 182 with the PRBS checker 238 sets the PRBS checker 238 to sample all (both even and odd) data bits of the PRBS. The Calibration Control Component 182 adjusts the second phase rotator 230 generating quadrature phase 90° and 270° clock signals to center the data eye of all data bits of the PRBS, using the PRBS checker 238 to complete calibration at block 412. At block 414, after calibration is completed and the PRBS stops, a functional data stream is started and sent to the quadrature receive serial interface circuit for normal data communication.

While the foregoing is directed to embodiments of the present invention, other and further embodiments of the invention may be devised without departing from the basic scope thereof, and the scope thereof is determined by the claims that follow.

What is claimed is:

1. A method comprising:
providing a quadrature receive serial interface circuit comprising a first phase rotator and a second phase rotator for generating quadrature clock signals of identical frequency, a plurality of first sampling latches for sampling received serial data, where the first phase rotator generates in-phase 0° and 180° clock signals and the second phase rotator generates quadrature phase 90° and 270° clock signals, and the generated in-phase 0° and 180° clock signals are used as clocking signals for a first pair of the plurality of the first sampling latches; and the generated quadrature phase 90° and 270° clock signals are used as clocking signals for a second pair of the plurality of the first sampling latches, and a pseudo random bit sequence (PRBS) checker;
receiving a pseudo random bit sequence (PRBS) of data bits for calibrating the quadrature receive serial interface circuit;
setting the PRBS checker to sample at least one-half of the received PRBS data bits;
adjusting the first phase rotator to center a data eye of the received sampled one-half PRBS data bits;
setting the PRBS checker to sample all of the received PRBS data bits; and
adjusting the second phase rotator to center the data eye of the received sampled all PRBS data bits to complete calibration of the quadrature receive serial interface circuit.

2. The method of claim 1, wherein the quadrature receive serial interface circuit further comprising a deserializer, the plurality of the first sampling latches coupled to the deserializer, the deserializer receiving and synchronizing sampled data bits to 0° phase and providing output data of the quadrature receive serial interface circuit.

3. The method of claim 1, wherein setting the PRBS checker to sample at least one-half of the received PRBS data bits comprises setting the PRBS checker to sample even bits of the received PRBS data bits.

4. The method of claim 1, wherein setting the PRBS checker to sample all of the received PRBS data bits comprises setting the PRBS checker to sample even and odd data bits of the received PRBS data bits.

5. The method of claim 1, wherein the quadrature receive serial interface circuit further comprising a deserializer, and the deserializer receiving and deserializing sampled PRBS serial data bits, and providing parallel PRBS output data to the PRBS checker.

6. The method of claim 1, wherein adjusting the first phase rotator comprises using the PRBS checker to check for valid parallel PRBS output data to identify valid data edges of the data eye, and adjusting the first phase rotator to center the data eye using the identified data edges.

7. The method of claim 1, further comprises using the PRBS checker for adjusting both the first phase rotator and the second phase rotator to center the data eye of received sampled PRBS data bits.

8. The method of claim 1, wherein providing the quadrature receive serial interface circuit comprising the first phase rotator and the second phase rotator for generating four quadrature clocks reduces required power for the quadrature receive serial interface circuit.

9. The method of claim 1, wherein calibrating the quadrature receive serial interface circuit is performed at system power-on and dynamically during system operation.

10. The method of claim 1, further comprises receiving a functional data stream for normal data communication of the quadrature receive serial interface circuit for normal data communication after calibration is completed.

11. A quadrature receive serial interface circuit comprising:
a first phase rotator;
a second phase rotator;
a plurality of first sampling latches for sampling received serial data, wherein the first phase rotator is configured to generate in-phase 0° and 180° clock signals and the second phase rotator is configured to generate quadrature phase 90° and 270° clock signals, and the generated in-phase 0° and 180° clock signals are used as clocking signals for a first pair of the plurality of the first sampling latches; and the generated quadrature phase 90° and 270° clock signals are used as clocking signals for a second pair of the plurality of the first sampling latches; and
a pseudo random bit sequence (PRBS) checker configured to calibrate the first phase rotator and the second phase rotator sequentially using sampled pseudo random bit sequence (PRBS) data bits.

12. The quadrature receive serial interface circuit of claim 11, wherein the quadrature receive serial interface circuit further comprising a deserializer, the plurality of the first sampling latches coupled to the deserializer, the deserializer receiving and synchronizing sampled data bits to 0° phase and providing output data of the quadrature receive serial interface circuit.

13. The quadrature receive serial interface circuit of claim 11, wherein the first phase rotator is calibrated using at least one-half of the PRBS data bits.

14. The quadrature receive serial interface circuit of claim 11, wherein the second phase rotator is calibrated using all of the PRBS data bits.

15. The quadrature receive serial interface circuit of claim 11, wherein calibrating the first phase rotator and the second phase rotator using sampled PRBS data bits, compensates for variations in received data bits.

16. A computer program product for calibrating a quadrature receive serial interface circuit, the quadrature receive serial interface circuit comprising a first phase rotator and a second phase rotator for generating quadrature clock signals of identical frequency, a plurality of first sampling latches for sampling received serial data, where the first phase rotator generates in-phase 0° and 180° clock signals and the second phase rotator generates quadrature phase 90° and 270° clock signals, and the generated in-phase 0° and 180° clock signals are used as clocking signals for a first pair of the plurality of the first sampling latches; and the generated quadrature phase 90° and 270° clock signals are used as clocking signals for a second pair of the plurality of the first sampling latches, and a pseudo random bit sequence (PRBS) checker, the computer program product comprising:

a computer-readable storage medium having computer-readable program code embodied therewith, the computer-readable program code executable by one or more computer processors to perform an operation comprising:

receiving a pseudo random bit sequence (PRBS) of data bits for calibrating the quadrature receive serial interface circuit;

setting the PRBS checker to sample at least one-half of the received PRBS data bits;

adjusting the first phase rotator to center a data eye of the received sampled one-half PRBS data bits;

setting the PRBS checker to sample all of the received PRBS data bits; and adjusting the second phase rotator to center the data eye of the received sampled all PRBS data bits to complete calibration of the quadrature receive serial interface circuit.

17. The computer program product of claim 16, wherein the quadrature receive serial interface circuit further comprising a deserializer coupled to the plurality of the first sampling latches, the deserializer receiving and synchronizing sampled data bits to 0° phase, and providing output data of the quadrature receive serial interface circuit.

18. The computer program product of claim 16, wherein setting the PRBS checker to sample one-half of the received PRBS data bits comprises setting the PRBS checker to sample even bits of the received PRBS data bits.

19. The computer program product of claim 16, wherein setting the PRBS checker to sample all of the received PRBS data bits comprises setting the PRBS checker s to sample even and odd data bits of the received PRBS data bits.

20. The computer program product of claim 16, further comprises using the PRBS checker for adjusting both the first phase rotator and the second phase rotator to center the data eye of received sampled PRBS data bits.

* * * * *